(12) United States Patent
Kim

(10) Patent No.: US 9,135,878 B2
(45) Date of Patent: Sep. 15, 2015

(54) SHIFT REGISTER AND LIQUID CRYSTAL DISPLAY DEVICE USING THE SAME

(75) Inventor: Seong Gyun Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 1736 days.

(21) Appl. No.: 11/026,768

(22) Filed: Dec. 30, 2004

(65) Prior Publication Data

US 2005/0264505 A1    Dec. 1, 2005

(30) Foreign Application Priority Data

May 27, 2004  (KR) .......................... 10-2004-0037724

(51) Int. Cl.
- *G09G 3/36* (2006.01)
- *G11C 19/28* (2006.01)
- *G02F 1/1345* (2006.01)
- *G11C 19/00* (2006.01)

(52) U.S. Cl.
CPC .............. *G09G 3/3677* (2013.01); *G11C 19/00* (2013.01); *G11C 19/28* (2013.01)

(58) Field of Classification Search
USPC ............................................ 345/100; 377/64
See application file for complete search history.

(56) References Cited

U.S. PATENT DOCUMENTS

| | | | | |
|---|---|---|---|---|
| 5,410,583 A * | 4/1995 | Weisbrod et al. | ................ | 377/75 |
| 5,434,899 A * | 7/1995 | Huq et al. | ........................ | 377/78 |
| 5,517,542 A * | 5/1996 | Huq | ................. | 377/78 |
| 5,859,630 A * | 1/1999 | Huq | ............... | 345/100 |
| 5,949,398 A * | 9/1999 | Kim | ............................. | 345/100 |
| 6,345,085 B1 * | 2/2002 | Yeo et al. | ......................... | 377/54 |
| 6,876,353 B2 * | 4/2005 | Morosawa et al. | ........... | 345/100 |
| 7,038,653 B2 * | 5/2006 | Moon | .......................... | 345/100 |
| 2003/0128180 A1 * | 7/2003 | Kim et al. | ..................... | 345/100 |
| 2004/0217935 A1 * | 11/2004 | Jeon et al. | ..................... | 345/100 |

FOREIGN PATENT DOCUMENTS

| | | |
|---|---|---|
| CN | 1116752 | 2/1996 |
| JP | 7-182891 | 7/1995 |
| KR | 10-0317408 | 2/2009 |

OTHER PUBLICATIONS

Office Action dated Feb. 9, 2007 for corresponding Chinese Patent Application No. 2004101009832.
Office Action corresponding to Japanese Patent Application Serial No. 2004-374584, dated Dec. 4, 2007.
Office Action issued in corresponding Korean Patent Application No. 10-2004-0037724; issued Aug. 30, 2010.

* cited by examiner

*Primary Examiner* — Grant Sitta
(74) *Attorney, Agent, or Firm* — Brinks Gilson & Lione

(57) ABSTRACT

A shift register is provided that outputs a gate driving pulse even if a start pulse provided to a first stage is not synchronized with a clock pulse. The shift register has multiple stages that sequentially output gate driving pulses. At least one stage includes a first switching device turned-on by a first clock signal and applying the start pulse to a first node. A second switching device is turned-on by the first clock signal and applies a first supply voltage to a second node. A third switching device is turned-on by the start pulse applied to the first node and outputs a second clock signal. A fourth switching device is turned-on by the first supply voltage and outputs a second supply voltage. A fifth switching device is turned-on by the start pulse and applies the start pulse to the first node.

4 Claims, 6 Drawing Sheets

SHIFT REGISTER AND LIQUID CRYSTAL DISPLAY DEVICE USING THE SAME

This application claims the benefit of Korean Application No. P2004-37724, filed on May 27, 2004, which is hereby incorporated by reference.

BACKGROUND

1. Field

The present application relates to a liquid crystal display (LCD) device, and a shift register and an LCD device using the same, in which synchronization between a start pulse and a clock signal is unnecessary.

2. Discussion of the Related Art

Demand for various display devices has increased with development of an information society. Accordingly, much effort have been expended to research and develop various flat display devices such as liquid crystal display (LCD), plasma display panel (PDP), electroluminescent display (ELD), and vacuum fluorescent display (VFD). Some species of flat display devices have already been applied to displays of various equipment.

Among the various flat display devices, liquid crystal display (LCD) devices have been most widely used due to advantageous characteristics of thin profile, lightness in weight, and low power consumption, whereby the LCD devices provide a substitute for a Cathode Ray Tube (CRT). In addition to mobile type LCD devices such as a display for a notebook computer, LCD devices have been developed for computer monitors and televisions to receive and display broadcast signals.

Despite various technical developments in the LCD technology with applications in different fields, research in enhancing the picture quality of the LCD device has been in some respects lacking as compared to other features and advantages of the LCD device. Therefore, in order to use the LCD device in various fields as a general display, the key to developing the LCD device lies on whether the LCD device can implement a high quality picture, such as high resolution and high luminance with a large-sized screen while still maintaining lightness in weight, thinness, and low power consumption.

In general, the LCD device includes an LCD panel for displaying an image and a driver for supplying a driving signal to the LCD panel. In addition, the LCD panel includes first and second glass substrates bonded to each other having a cell gap therebetween, and a liquid crystal layer formed between the first and second glass substrates.

The first glass substrate (TFT array substrate) includes a plurality of gate lines arranged along a first direction at fixed intervals, a plurality of data lines arranged along a second direction perpendicular to the first direction at fixed intervals, a plurality of pixel electrodes arranged in a matrix-type configuration within pixel regions defined by crossing of the gate and data lines, and a plurality of thin film transistors enabled according to signals supplied to the gate lines for transmitting signals from the data lines to the pixel electrodes.

Also, the second glass substrate (color filter array substrate) includes a black matrix layer that prevents light from portions of the first substrate other than the pixel regions, an R/G/B color filter layer for displaying various colors, and a common electrode for producing the image. The cell gap is maintained between the first and second substrates by spacers, and then the first and second substrates are bonded together by a sealant.

Hereinafter, a driving circuit of a related art LCD device will be described as follows. FIG. 1 is a block diagram of a driving circuit of a related art LCD device. As shown in FIG. 1, a related art LCD device includes an LCD panel 21 having a plurality of gate and data lines G and D crossing each other to define a plurality of pixel regions arranged in a matrix-type configuration, a driving circuit 22 for providing a scanning signal and a data signal to the LCD panel 21, and a backlight 28 for providing a uniform light source to the LCD panel 21.

The driving circuit 22 includes a data driver 21b, a gate driver 21a, a timing controller 23, a power supply unit 24, a gamma reference voltage unit 25, a DC/DC converter 26, and an inverter 29. The data driver 21b inputs a data signal to each data line D of the LCD panel 21, and the gate driver 21a supplies a scanning signal to each gate line G of the LCD panel 21. Then, the timing controller 23 receives display data R/G/B, vertical and horizontal synchronous signals Vsync and Hsync, a clock signal DCLK and a control signal DTEN from a driving system 27 of the LCD panel 21, and formats the display data, the clock signal and the control signal at a timing suitable for restoring a picture image by the gate driver 21a and the data driver 21b of the LCD panel 21. The power supply unit 24 supplies a voltage to the LCD panel 21 and respective units. Also, the gamma reference voltage unit 25 receives power from the power supply unit 24 to provide a reference voltage required when digital data inputted from the data driver 21b is converted to analog data. The DC/DC converter 26 outputs a constant voltage $V_{DD}$, a gate high voltage $V_{GH}$, a gate low voltage $V_{GL}$, a reference voltage $V_{ref}$, and a common voltage $V_{com}$ for the LCD panel 21 by using a voltage outputted from the power supply unit 24. Also, the inverter 29 drives the backlight 28.

An operation of the driving circuit of the related art LCD device will be described as follows. That is, the timing controller 23 receives the display data R/G/B, the vertical and horizontal synchronous signals Vsync and Hsync, the clock signal DCLK, and the control signal DTEN from the driving system 27 of the LCD panel, and provides the display data, the clock signal, and control signal at the timing suitable for restoring the picture image by the gate driver 21a and the data driver 21b of the LCD panel 21. Thus, the gate driver 21a supplies the scanning signal to each gate line G of the LCD panel 21, whereby the data driver 21b supplies the data signal to each data line D of the LCD panel 21, thereby displaying the inputted image signal. The gate driver includes a shift register for sequentially providing the scanning signal to each gate line.

Hereinafter, a related art shift register will be described with reference to the accompanying drawings. FIG. 2 is a schematic view of a related art shift register. FIG. 3 is a circuit diagram for each stage of FIG. 2. As shown in FIG. 2, the related art shift register includes a plurality of stages (51a, 51b, 51c, 51d, ..., 51n) for receiving clock signals CLKA and CLKB, and supply voltages VDD and VSS to synchronously output gate driving pulses for driving respective gate lines G in sequence.

The first stage 51a receives a start pulse SP, the first clock signal CLKA, the second clock signal CLKB, the first supply voltage VDD, and the second supply voltage VSS, and then outputs the first gate driving pulse Vout1. The second stage 51b receives the first gate driving pulse Vout1 of the first stage 51a, the first clock signal CLKA, the second clock signal CLKB, the first supply voltage VDD, and the second supply voltage VSS, and then outputs the second gate driving pulse Vout2, wherein the second gate driving pulse Vout2 is delayed by one period from the first gate driving pulse Vout1. The n-th stage 51n receives the (n−1)th gate driving pulse Voutn−1 of the (n−1)th stage 51*n*−1, the first clock signal CLKA, the second clock signal CLKB, the first supply voltage VDD, and the second supply voltage VSS, and then outputs the n-th gate driving pulse Voutn, wherein the n-th gate driving pulse Voutn is delayed by one period from the (n−1)th gate driving pulse Voutn−1.

In brief, only the first stage 51*a* receives the start pulse SP. Meanwhile, the remaining of the stages, from the second stage to the n-th stage 51*b* to 51*n* respectively, use the output driving pulse (Vout1 to Voutn−1) of the prior stage, so that the remaining stages output a gate driving pulse (Vout2 to Voutn) that is delayed by one period from the prior output diving pulse (Vout1 to Voutn−1). Accordingly, the gate driving pulses (Vout1 to Voutn) outputted from the respective stages (51*a*, 51*b*, 51*c*, 51*d*, . . . , 51*n*) are provided to the respective gate lines G, thereby scanning the gate lines G in sequence.

For this, each of the stages (51*a*, 51*b*, 51*c*, 51*d*, . . . , 51*n*) has a circuit shown in FIG. 3. The circuit for each stage (51*a*, 51*b*, 51*c*, 51*d*, . . . , 51*n*) has the same structure. However, the first and second clock signals CLKA and CLKB are alternately applied to the odd numbered stages (51*a*, 51*c*, 51*e*, . . . ), and the even numbered stages (51*b*, 51*d*, . . . ). Herein, the circuit for the first stage 51*a* will be explained as follows.

That is, as shown in FIG. 3, the first stage 51*a* further includes a first PMOS transistor T1, a second PMOS transistor T2, a third PMOS transistor T3, a fourth PMOS transistor T4, a fifth PMOS transistor T5, and a sixth PMOS transistor T6. The first PMOS transistor T1 is turned-on/off by logic of the first clock signal CLKA, and the first PMOS transistor T1 provides the start pulse SP to a first node P1 when in the turned-on state. Also, the second PMOS transistor T2 is turned-on/off by logic of the first clock signal CLKA, and the second PMOS transistor T2 provides the first supply voltage VDD to a second node P2 when in the turned-on state. The third PMOS transistor T3 is turned-on/off by logic of the start pulse SP charged in the first node P1, and the third PMOS transistor T3 provides the second clock signal CLKB to an output line 50*a* when in the turned-on state. The fourth PMOS transistor T4 is turned-on/off dependent on the state of the second node P2, and the fourth PMOS transistor T4 provides the second supply voltage VSS to the output line 50*a* when in the turned-on state. The fifth PMOS transistor T5 is turned-on/off by logic of the start pulse SP charged in the first node P1, and the fifth PMOS transistor T5 passes the second supply voltage VSS when in the turned-on state. The sixth PMOS transistor T6 is turned-on/off by logic of the second clock signal CLKB, and the sixth PMOS transistor T6 charges the second node P2 with the second supply voltage VSS passing through the fifth PMOS transistor T5 when in the turned-on state.

In this case, the second node P2 may be charged with the first supply voltage VDD or the second supply voltage VSS. If the second node P2 is charged with the first supply voltage VDD of low logic, the fourth PMOS transistor T4 connected with the second node P2 is turned-on. If the second node P2 is charged with the second supply voltage VSS of high logic, the fourth PMOS transistor T4 is turned-off.

Meanwhile, the second clock signal CLKB provided to the output line 50*a* of the first stage 51*a* through the third PMOS transistor T3 or the fourth PMOS transistor T4 is used for the first gate driving pulse Vout1, and also is used for the start pulse SP of the next stage 51*b*.

As described above, for the odd numbered stages (51*a*, 51*c*, 51*e*, . . . ), the first clock signal CLKA is applied to gate terminals of the first PMOS transistor T1 and the second PMOS transistor T2, and the second clock signal CLKB is applied to a source terminal of the third PMOS transistor T3. For the even numbered stages (51*b*, 51*d*, . . . ), the second clock signal CLKB is applied to the gate terminals of first PMOS transistor T1 and the second PMOS transistor T2, and the first clock signal CLKA is applied to the source terminal of the third PMOS transistor T3.

An operation of the shift register will be described as follows. FIG. 4 is a timing view for each signal provided to a related art shift register.

First, an operation of the shift register during a first period (A) will be described in detail. That is, as shown in FIG. 4, during the first period (A), the start pulse SP and the first clock signal CLKA are maintained in the low logic state, and the second clock signal CLKB is maintained in the high logic state. The first clock signal CLKA of the low logic state is applied to the gates of the first PMOS transistor T1 and the second PMOS transistor T2.

Then, the first PMOS transistor T1 and the second PMOS transistor T2 are turned-on by the first clock signal CLKA of the low logic state. Thus, the start pulse SP of the low logic state, applied to the source of the first PMOS transistor T1, is provided to the first node P1 through the first PMOS transistor T1, and the first supply voltage VDD of the low logic state, applied to the source of the second PMOS transistor T2, is provided to the second node P2 through the second PMOS transistor T2.

After that, the third PMOS transistor T3 and the fifth PMOS transistor T5, connected with the first node P1 by the gate, are turned-on by the start pulse SP of low logic charged in the first node P1. Also, the fourth PMOS transistor T4 is turned-on by the first supply voltage VDD of low logic charged in the second node P2. Accordingly, the second supply voltage VSS of high logic as well as the high logic of the second clock signal CLKB, is provided to the output line 50*a* through the fourth PMOS transistor T4. The second clock signal CLKB of high logic is also applied to the gate of the sixth PMOS transistor T6, thereby turning-off the sixth PMOS transistor T6.

Next, an operation of the shift register during a second period (B) will be explained as follows. During the second period (B), the start pulse SP and the first clock signal CLKA are changed to the high logic state, so that the second clock signal CLKB is changed to the low logic state. Thus, the first clock signal CLKA of high logic is applied to the first PMOS transistor T1 and the second PMOS transistor T2 through each gate, whereby the first PMOS transistor T1 and the second PMOS transistor are turned-off. That is, the start pulse SP of low logic charged during the first period (A) is maintained in the same state.

Accordingly, the third PMOS transistor T3 and the fifth PMOS transistor T5 are maintained in the turned-on state by the start pulse SP of low logic charged in the first node P1. As described above, during the second period (B), according as the second clock signal CLKB is changed to the low logic state, the sixth PMOS transistor T6 is turned-on, so that the second supply voltage VSS (+V) of high logic is provided to the second node P2 through the fifth PMOS transistor T5 and the sixth PMOS transistor T6. Thus, the fourth PMOS transistor T4 is turned-off by the second supply voltage VSS of high logic charged in the second node P2, so that the second clock signal CLKB of low logic is provided to the output line 50*a* through the third PMOS transistor T3.

At this time, during the second period (B), the first PMOS transistor T1 and the second PMOS transistor T2 are turned-off, so that the first node P1 is in the floating state. Also, the start pulse SP of the first node P1 is lowered in correspondence with the second clock signal CLKB of low logic provided to the output line 50*a* by a parasitic capacitance between the gate and drain of the third PMOS transistor T3. Thus, the higher start pulse SP is applied to the gate of the third PMOS transistor T3, so that a threshold voltage of the third PMOS transistor T3 is lowered. That is, the second clock signal CLKB of low logic is provided to the output line 50a without loss.

Next, an operation of the shift register during a third period (C) will be described as follows. During the third period (C), the start pulse SP is maintained in the high logic state, and the first clock signal CLKA is changed to the low logic state, whereby the second clock signal CLKB is changed to the high logic state. Accordingly, the first PMOS transistor T1 and the second PMOS transistor T2 are turned-on again by the first clock signal CLKA of low logic, and the start pulse SP of high logic is provided to the first node P1 through the first PMOS transistor T1 being turned-on. Thus, the first supply voltage VDD (−V) of low logic is provided to the second node P2 through the second PMOS transistor T2.

After that, the third PMOS transistor T3 and the fifth PMOS transistor T5 are turned-off by the start pulse SP of high logic charged in the first node P1, and the fourth PMOS transistor T4 is turned-on by the first supply voltage VDD of low logic charged in the second node P2. Also, the second clock signal CLKB of high logic is applied to the gate of the sixth PMOS transistor T6, thereby turning-off the sixth PMOS transistor T6. Accordingly, the second supply voltage VSS of high logic is applied to the output line 50a through the fourth PMOS transistor T4.

In this case, the second clock signal CLKB of low logic provided to the output line 50a of the first stage 51a during the second period (B) corresponds to the first gate driving pulse Vout1 for driving the gate line G. Simultaneously, the first gate driving pulse Vout1 outputted from the output line 50a of the first stage 51a is applied to the source terminal of the first PMOS transistor T1 of the second stage 51b, and the second clock signal CLKB is applied to the gate terminals of the first PMOS transistor T1 and the second PMOS transistor T2. Accordingly, the first clock signal CLKA is outputted as the second gate driving pulse Vout2 to the output line 50b of the second stage 51b, wherein the first clock signal CLKA of low logic of the second gate driving pulse Vout2 is delayed (shifted) by one period from the first clock signal CLKA of low logic of the first stage 51a. As a result, the first to n-th gate driving pulses (Vout1 to Voutn) are sequentially provided to the gate lines G by the shift register.

Meanwhile, the start pulse SP may be outputted or not dependent on the logic of the first clock signal CLKA, so that the start pulse SP provided to the first stage is outputted in synchronization with the first clock signal CLKA. That is, as explained above, the first clock signal CLKA is provided to the gate of the first PMOS transistor T1, thereby turning-on/off the first PMOS transistor T1. To charge the start pulse SP in the first node P1 during the first period (A), the first PMOS transistor T1 is maintained in the turned-on state for applying the start pulse SP. For this, the first clock signal CLKA provided to the gate of the first PMOS transistor T1 is necessarily maintained in the low logic state during the first period (A). Thus, in order to operate the related art shift register normally, it is necessary to synchronize the first clock signal CLKA with the start pulse SP.

SUMMARY

A shift register and an LCD device using the same are provided to output a gate driving pulse even if a clock signal provided to a first stage is not synchronized with a start pulse.

By way of introduction, in one aspect, a shift register contains a plurality of stages that sequentially output gate driving pulses. At least one of the stages includes first through fifth switching devices. The first switching device is turned-on by a first clock signal and applies a start pulse to a first node. The second switching device is turned-on by the first clock signal and applies a first supply voltage to a second node. The third switching device is turned-on by the start pulse applied to the first node and supplies a second clock signal to an output of the stage. The fourth switching device is turned-on by the first supply voltage applied to the second node and supplies a second supply voltage to the output of the stage. The fifth switching device is turned-on by the start pulse and applies the start pulse to the first node.

In another aspect, a display device contains a display panel having a plurality of gate and data lines crossing each other and a gate driver that provides gate driving pulses sequentially to the gate lines of the LCD panel. The gate driver contains a shift register similar to the immediately preceding shift register.

In another aspect, a shift register of an LCD display device includes a plurality of stages to which a start pulse and a plurality of clock signals are applied. A first stage of the plurality of stages contains means for permitting the start pulse to be supplied at a time independent of synchronization with any of the plurality of clock signals, the first stage supplying an output to a first gate line of the LCD display device.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a shift register and an LCD device using the same according to the present invention will be described with reference to the accompanying drawings.

Figure 5:
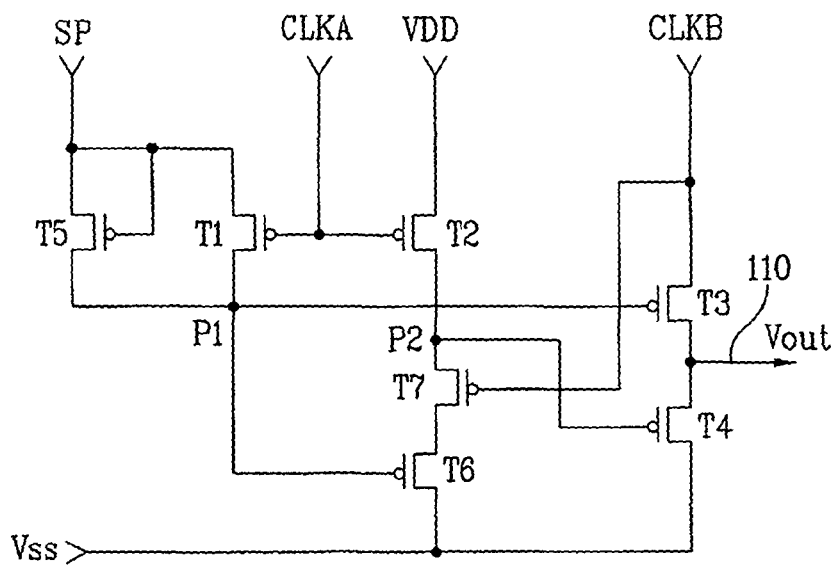
FIG. 5 is a circuit diagram of a stage for a shift register according to an embodiment of the present invention.
Figure 6:
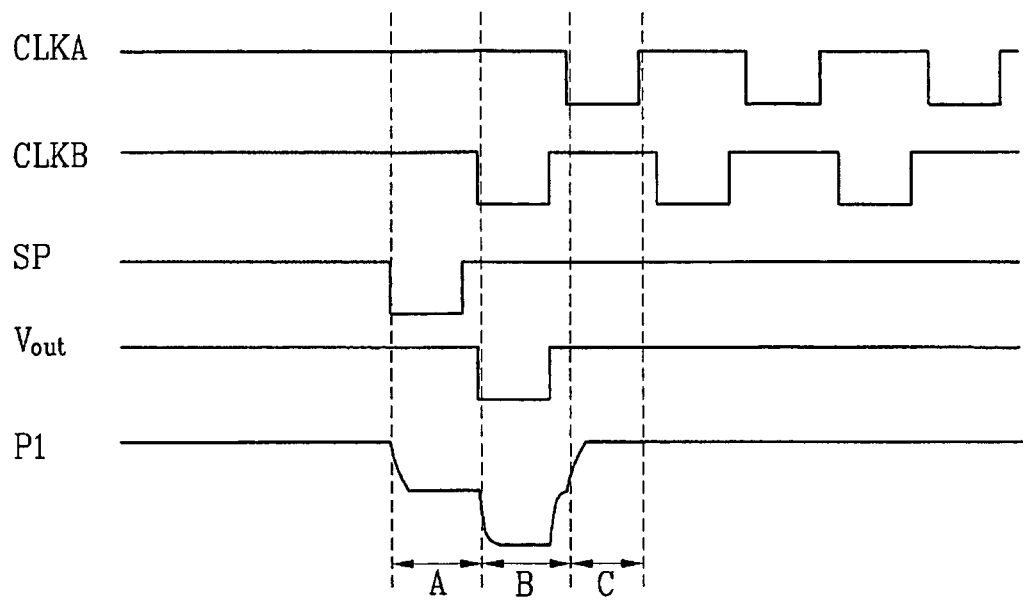
FIG. 6 is a timing view of a start pulse that is not synchronized with a first clock signal in the shift register of FIG. 5.
Figure 7:
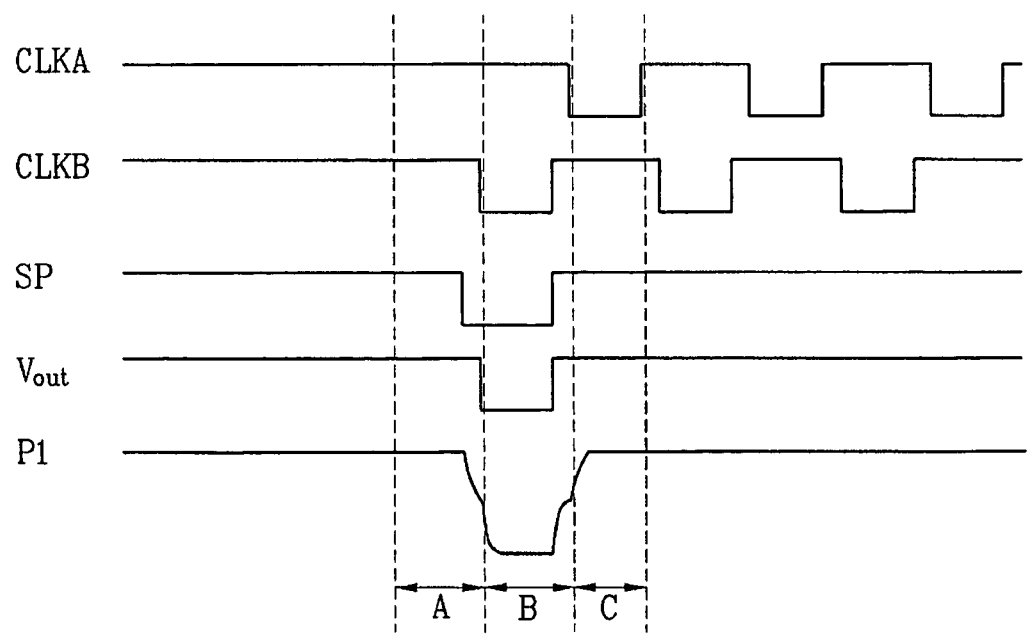
FIG. 7 is a timing view of various signals to when inconsistent timing of a start pulse is applied to the shift register of FIG. 5.
Figure 8:
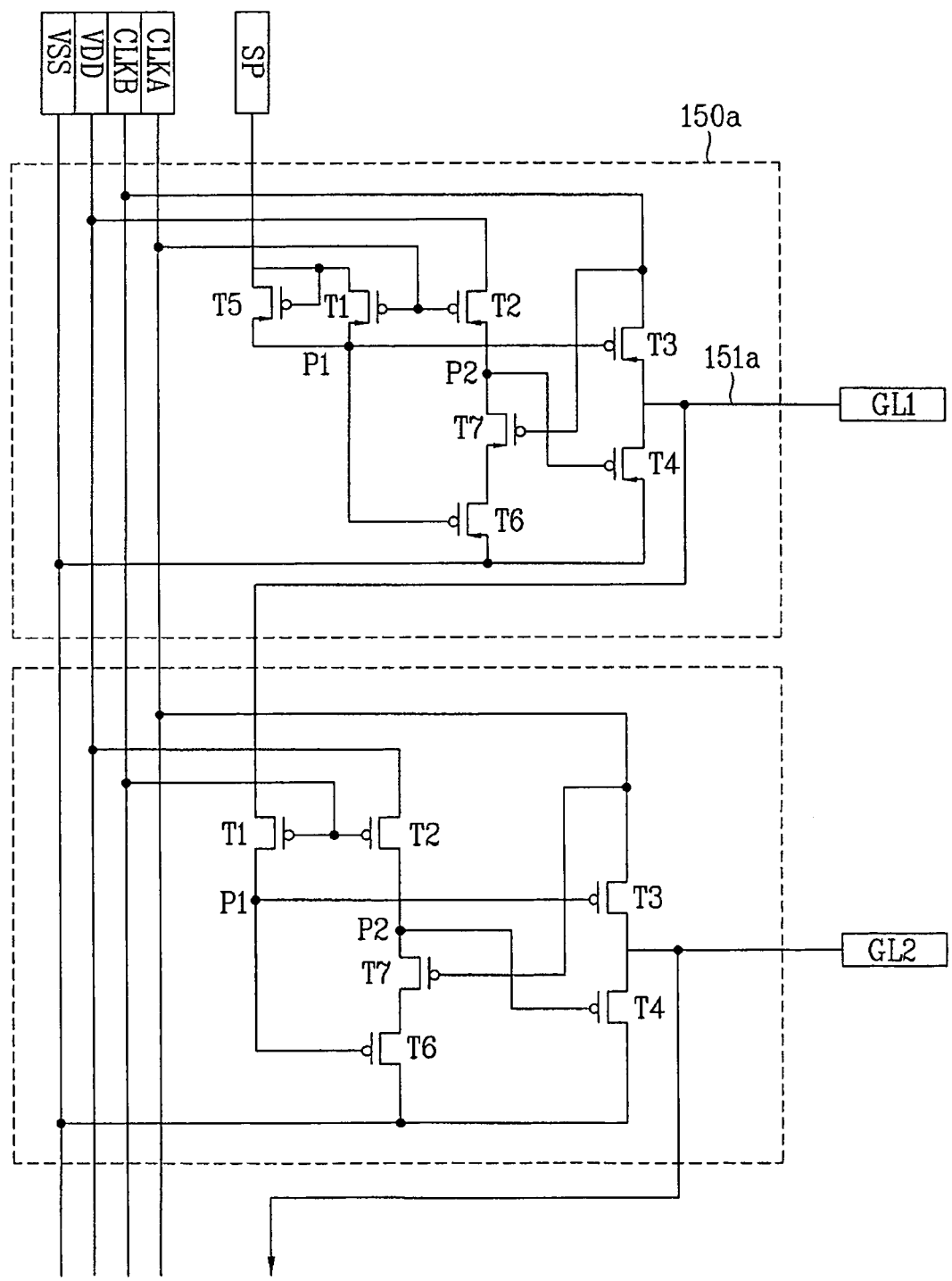
FIG. 8 is a schematic view of an LCD device using the shift register of FIG. 5.

FIG. 5 is a circuit diagram of a stage for a shift register according to an embodiment of the present invention. FIG. 6 is a timing view of explaining the state a start pulse is not synchronized with a first clock signal in a shift register according to the embodiment of the present invention. FIG. 7 is a timing view of various signals to explain the state of an inconsistent timing of a start pulse according to the embodiment of the present invention. FIG. 8 is a schematic view of an LCD device of using a shift register according to the present invention.

The shift register according to the embodiment of the present invention includes a plurality of stages for receiving various clock signals CLKA and CLKB and supply voltages VDD and VSS, and synchronously outputting gate driving pulses of driving gate lines G in sequence.

As shown in FIG. 5, each stage includes a first PMOS transistor T1, a second PMOS transistor T2, a third PMOS transistor T3, a fourth PMOS transistor T4, a fifth PMOS transistor T5, a sixth PMOS transistor T6, and a seventh PMOS transistor T7. The first PMOS transistor T1 is turned-on/off by logic of the first clock signal CLKA (or the second clock signal CLKB), and the first PMOS transistor T1 applies a start pulse SP (or output from a prior stage) to a first node P1 when in the turned-on state. The second PMOS transistor T2 is turned-on/off by logic of the first clock signal CLKA (or the second clock signal CLKB), and the second PMOS transistor T2 applies the first supply voltage VDD to a second node P2 when in the turned-on state. The third PMOS transistor T3 is turned-on/off depending on the state of the first node P1, and the third PMOS transistor T3 provides the second clock signal CLKB (or the first clock signal CLKA) to an output line 110 when in the turned-on state. The fourth PMOS transistor T4 is turned-on/off depending on the state of the second node P2, and the fourth PMOS transistor T4 provides the second supply voltage VSS to the output line 110. The fifth PMOS transistor T5 is turned-on/off by logic of the start pulse SP (or output from a prior stage), and the fifth PMOS transistor T5 applies the start pulse SP (or output from a prior stage) to the first node P1 when in the turned-on state. The sixth PMOS transistor T6 is turned-on/off depending on the state of the first node P1, and the sixth PMOS transistor T6 passes the second supply voltage VSS when in the turned-on state. The seventh PMOS transistor T7 is turned-on/off by logic of the second clock signal CLKB (or the first clock signal CLKA), and the seventh PMOS transistor T7 applies the second supply voltage VSS to the second node P2 through the sixth PMOS transistor T6 when in the turned-on state.

Herein, the second node P2 may be charged with the first supply voltage VDD or the second supply voltage VSS. In case the second node P2 is charged with the first supply voltage VDD of low logic, the fourth PMOS transistor T4 having a gate connected with the second node P2 is turned-on. If the second node P2 is charged with the second supply voltage VSS of high logic, the fourth PMOS transistor T4 is turned-off.

As explained above, for the odd numbered stages (51a, 51c, 51e, . . . ), the first clock signal CLKA is applied to gate terminals of the first PMOS transistor T1 and the second PMOS transistor T2, and the second clock signal CLKB is applied to a source terminal of the third PMOS transistor T3. For the even numbered stages (51b, 51d, . . . ), the second clock signal CLKB is applied to the gate terminals of the first PMOS transistor T1 and the second PMOS transistor T2, and the first clock signal CLKA is applied to the source terminal of the third PMOS transistor T3. In this state, the start pulse or the output signal of the prior stage is applied to the source and gate of the fifth PMOS transistor T5 in common.

The fifth PMOS transistor T5 is connected with the first PMOS transistor T1 in parallel, so that the start pulse SP need not be synchronized with the first clock signal CLKA. That is, in the related art, the first PMOS transistor T1 for applying the start pulse SP is controlled under logic of the first clock signal CLKA, so that it is necessary to synchronously apply the start pulse SP and the first clock signal CLKA of low logic. Meanwhile, the shift register according to the embodiment further includes a fifth PMOS transistor T5, which is turned-on by the start pulse SP without regard to the logic of the first clock signal CLKA.

An operation of the shift register according to the embodiment of the present invention will be described in detail.

First, the case of synchronously inputting the start pulse and the first clock signal CLKA in the circuit of the shift register of FIG. 5 will be explained as follows. Supposing that various clock signals CLKA and CLKB and supply voltages VDD and VSS provided to the shift register according to the embodiment are the same as those in the related art timing view shown in FIG. 4.

Figure 4:
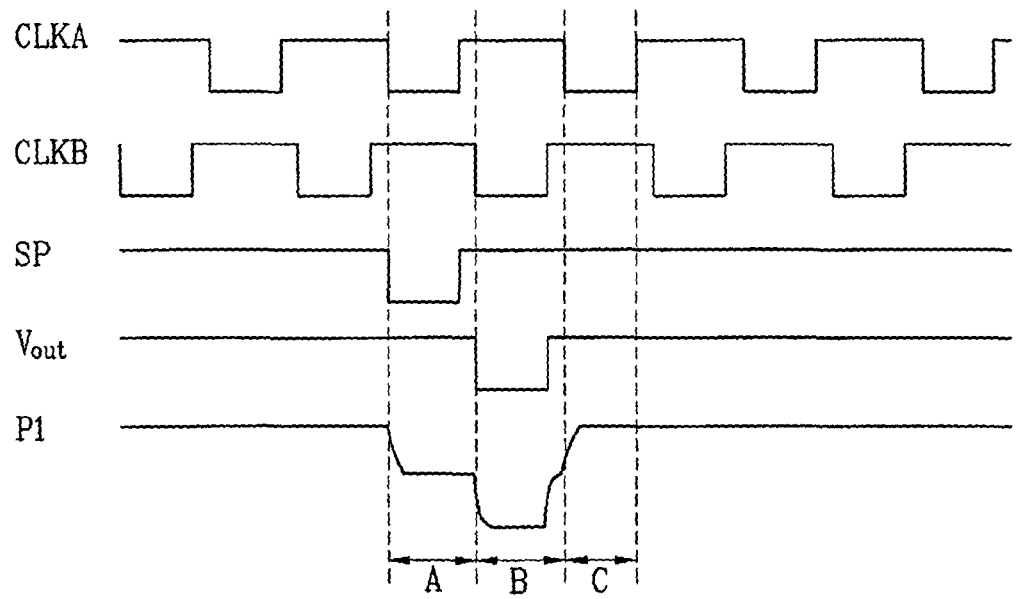
FIG. 4 is a timing view for each signal provided to a related art shift register.

An operation of the shift register during a first period (A) will be explained as follows. That is, as shown in FIG. 4, during the first period (A), the start pulse SP and the first clock signal CLKA are maintained in the low logic state, and the second clock signal CLKB is maintained in the high logic state. Then, the start pulse SP of low logic is applied to the source and gate of the fifth PMOS transistor T5. Thus, the fifth PMOS transistor T5 is turned-on by the start pulse SP of low logic, and the start pulse SP of low logic applied to the source of the fifth PMOS transistor T5 is provided to the first node P1 through the fifth PMOS transistor T5.

Also, during the first period (A), the first clock signal CLKA of low logic is simultaneously applied to the gates of the first PMOS transistor T1 and the second PMOS transistor T2, whereby the first PMOS transistor T1 and the second PMOS transistor T2 are turned-on together. Thus, the start pulse SP of low logic is applied to the first node P1 through the first PMOS transistor T1, and the first supply voltage VDD of low logic is applied to the second node P2 through the second PMOS transistor T2. Accordingly, the gate driving pulses are sequentially applied to the gate lines according to the same process as the related art.

Next, when the start pulse SP is not synchronized with the clock signal will be described as follows. During the first period (A), the first clock signal CLKA of high logic is applied to the gate of the first PMOS transistor T1 as shown in FIG. 6, or the clock signal having a timing not in correspondence with that of the start pulse SP is applied to the gate of the first PMOS transistor T1, the first PMOS transistor T1 is turned-off, so that it is impossible to pass the start pulse SP through the first PMOS transistor T1.

However, the fifth PMOS transistor T5 is not influenced by the logic of the first clock signal CLKA, whereby the fifth PMOS transistor T5 is turned-on/off by the logic of the start pulse SP. That is, even if the first PMOS transistor T1 is turned-off, the start pulse SP is provided to the first node P1 through the fifth PMOS transistor T5 as it is turned-on by the start pulse SP. Accordingly, the first clock signal CLKA of low logic and the start pulse SP are not required to be synchronous.

Subsequently, the start pulse SP of low logic charged in the first node P1 is applied to the gates of the third PMOS transistor T3 and the sixth PMOS transistor T6, thereby turning-on the third PMOS transistor T3 and the sixth PMOS transistor T6. Also, the first supply voltage VDD of low logic charged in the second node. P2 is applied to the gate of the fourth PMOS transistor T4, thereby turning-on the fourth PMOS transistor T4.

Accordingly, the second clock signal CLKB of high logic passing through the third PMOS transistor T3 and the second supply voltage VSS of high logic passing through the fourth PMOS transistor T4 being turned-on are simultaneously provided to the output line 110. Eventually, the second clock signal CLKB of high logic is provided to the output line 110. Meanwhile, the second clock signal CLKB of high logic is applied to the seventh PMOS transistor T7, thereby turning-off the seventh PMOS transistor T7.

Next, an operation of the shift register during a second period (B) will be described as follows. During the second period (B), the start pulse SP and the first clock signal CLKA are changed to the high logic state, and the second clock signal CLKB is changed to the low logic state. Accordingly, the first PMOS transistor T1, the second PMOS transistor T2, and the fifth PMOS transistor T5 are turned-off by the first clock signal CLKA of high logic and the start pulse SP of high logic, so that the start pulse SP of low logic charged during the first period (A) is maintained in the first node P1. As a result, the third PMOS transistor T3 and the sixth PMOS transistor T6 are maintained in the turned-on state, wherein the start pulse SP of low logic of the first node P1 is applied to the third PMOS transistor T3 and the sixth PMOS transistor T6 through the gate.

Meanwhile, as described above, the second clock signal CLKB is changed to the low logic state, during the second period (B), so that the seventh PMOS transistor T7, to which the second clock signal CLKB of low logic is applied through the gate, is turned-on. Thus, the second supply voltage VSS is provided to the second node P2 by the sixth PMOS transistor T6 and the seventh PMOS transistor T7. That is, the fourth PMOS transistor T4 is turned-off by the second supply voltage VSS of high logic charged in the second node P2. As a result, the second clock signal CLKB of low logic is provided to the output line 110 by the third PMOS transistor T3.

At this time, the first PMOS transistor T1, the second PMOS transistor T2, and the seventh PMOS transistor T7 are turned-off during the second period (B), whereby the first node P1 is in the floating state. Also, as shown in FIG. 6, the start pulse SP of the first node P1 is lowered in correspondence with the second clock signal CLKB of low logic provided to the output line 110 by a parasitic capacitance between the gate and drain of the third PMOS transistor T3. Accordingly, the higher start pulse SP is applied to the gate of the third PMOS transistor T3, so that a threshold voltage of the third PMOS transistor T3 is lowered. Thus, the second clock signal CLKB of low logic is provided to the output line 110 without loss.

Next, an operation of the shift register during a third period (C) will be described as follows. During the third period (C), the start pulse SP is maintained in the high logic state, and the first clock signal CLKA is changed to the low logic state, whereby the second clock signal CLKB is changed to the high logic state. Thus, the fifth PMOS transistor T5 having the gate through which the start pulse SP of high logic passes is turned-off, and the first and second PMOS transistors T1 and T2 having the gates through which the first clock signal CLKA of low logic passes are turned-on again.

Then, the start pulse SP of high logic is provided to the first node P1 by the first PMOS transistor T1, and the first supply voltage VDD of low logic is provided to the second node P2 by the second PMOS transistor T2. Also, the third and sixth PMOS transistors T3 and T6 are turned-off by the start pulse SP of high logic charged in the first node P1, and the fourth PMOS transistor T4 is turned-on by the first supply voltage VDD of low logic charged in the second node P2. Accordingly, the second supply voltage VSS of high logic is provided to the output line 110 by the fourth PMOS transistor T4.

As described above, the shift register further includes the fifth PMOS transistor T5 that passes the start pulse SP without regard to the logic of the first clock signal CLKA, so that the first clock signal CLKA need not be synchronized with the start pulse SP.

Referring to FIG. 7, when the start pulse SP does not corresponding to the timing of the clock signal, even though the first PMOS transistor T1 is turned-off, the start pulse SP is provided to the first node P1 through the fifth PMOS transistor T5, which is turned-on by the start pulse SP. Then, when the first node P1 is charged with the low logic state, the second clock signal CLKB applied to the source terminal of the third PMOS transistor T3 is outputted to the output terminal, so that the low logic state of the second clock signal CLKB is outputted to the output terminal.

Also, as shown in FIG. 8, an LCD device of using the aforementioned shift register includes an LCD panel (not shown) having a plurality of gate lines (G1, G2, . . . ) and a plurality of data lines (not shown), the gate and data lines crossing each other to define a pixel region, and a plurality of stages (150a, 150b, . . . ) for sequentially providing gate driving pulses to the gate lines (G1, G2, . . . ) of the LCD panel.

Figure 1:
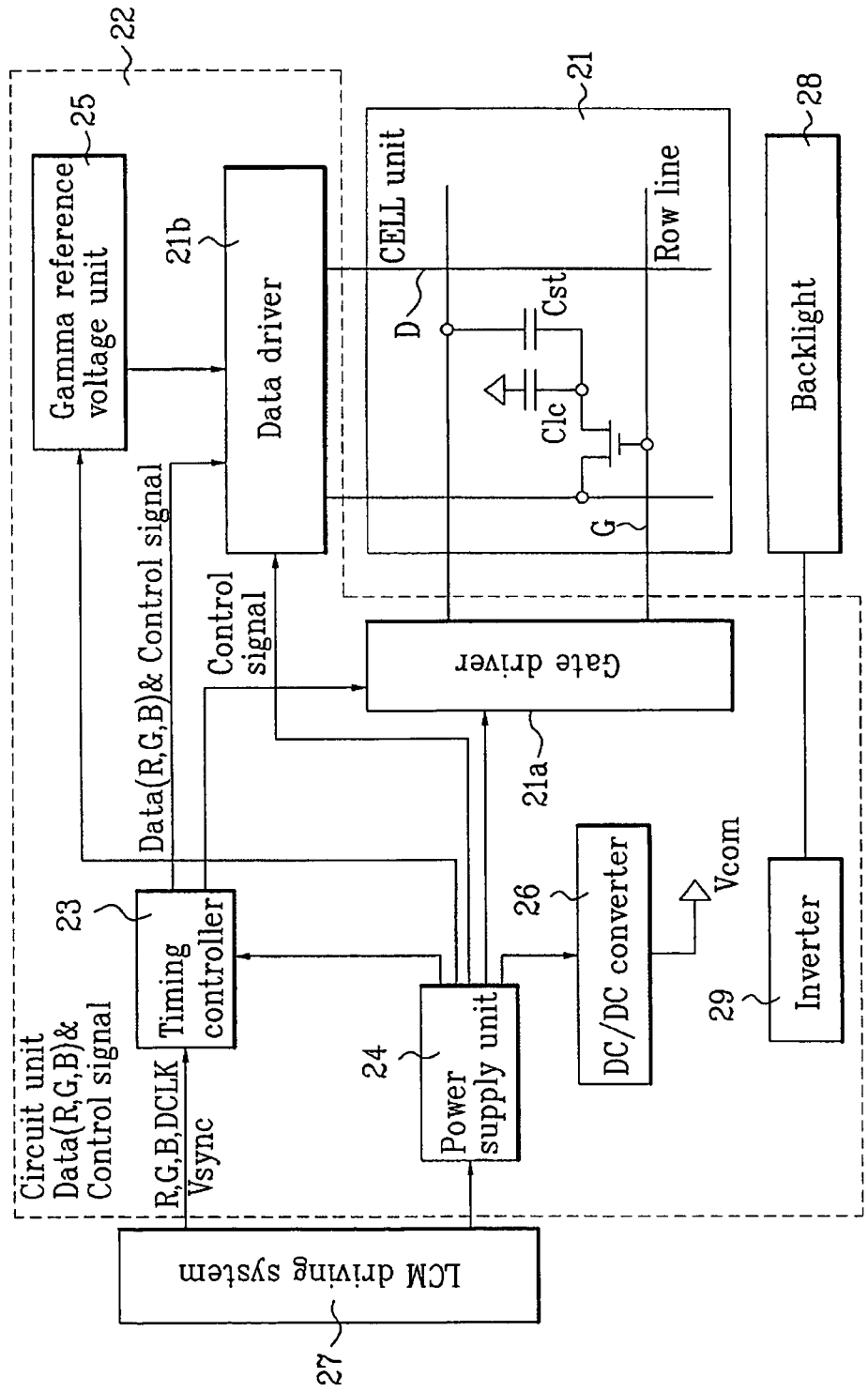
FIG. 1 is a block diagram of a driving circuit of a related art LCD device.
Figure 2:
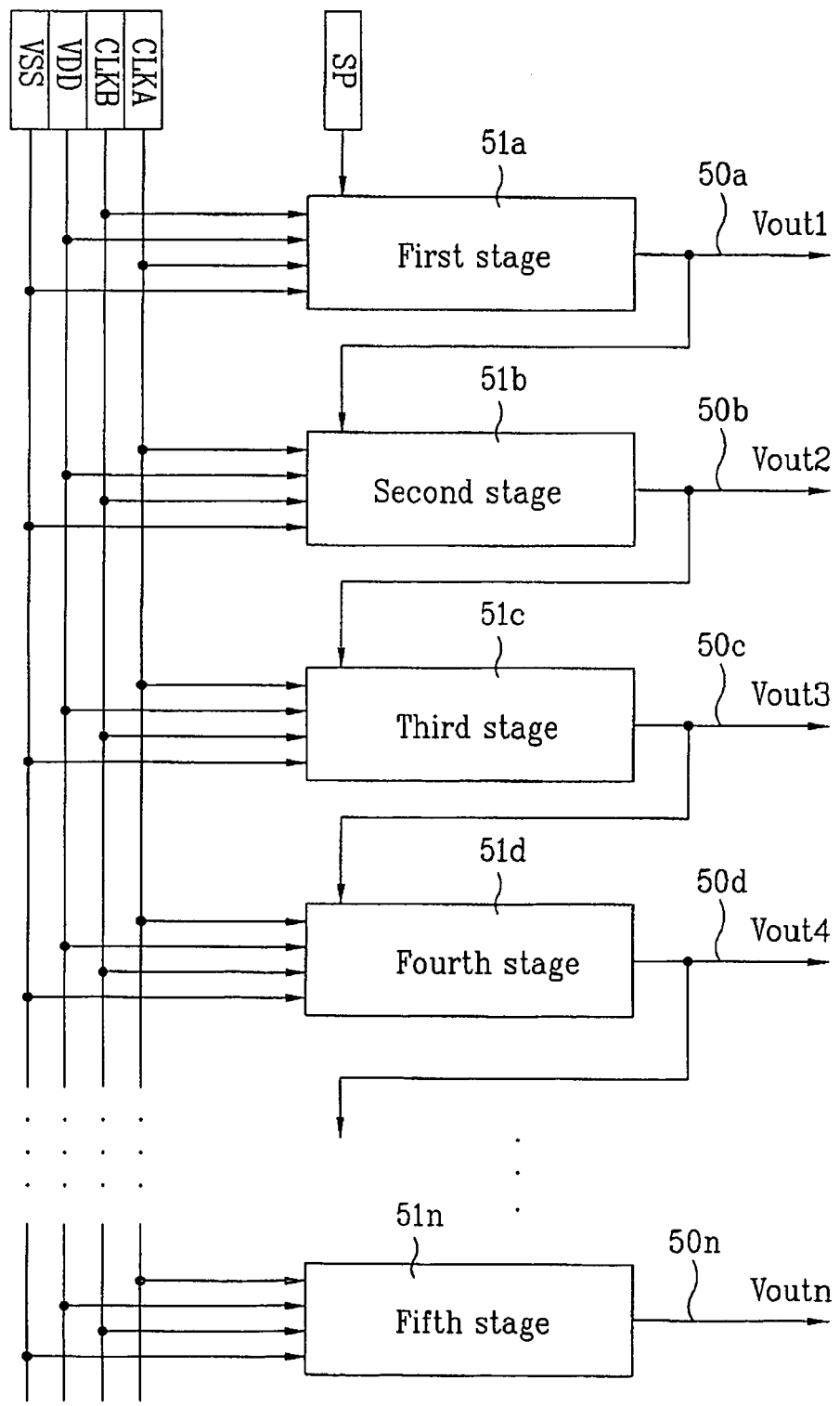
FIG. 2 is a schematic view of a related art shift register.
Figure 3:
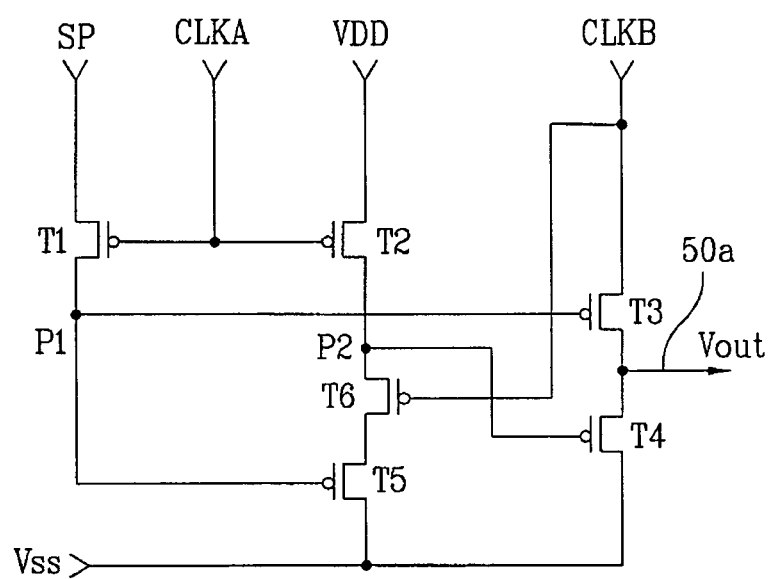
FIG. 3 is a circuit diagram for each stage of FIG. 2.

Each of the plurality of stages (150a, 150b, . . . ) may have the structure shown in FIG. 5. In another aspect, only the first stage 150a may have the structure shown in FIG. 5, and the remaining stages may have the same structure as that of the related art shown in FIG. 3.

That is, the start pulse SP is applied to only the first stage 150a, and the output signal of the prior stage is outputted to each of the remaining stages from the second stage to the n-th stage (150b, . . . ). Also, only the first stage 150a further includes the fifth PMOS transistor T5. Meanwhile, since the remaining stages from the second stage to the n-th stage (150b to 150n) use the output signal from the first stage 150a, the second stage to the n-th stage (150n to 150n) may or may not use the fifth PMOS transistor T5.

Thus, the start pulse SP is applied to only the first stage 150a, and the output signal (gate driving pulse) of the prior stage is applied to each of the remaining stages from the second stage to the n-th stage (150b, . . . ). As a result, each of the second stage to the n-th stage (150b, . . . ) outputs the gate driving pulse delayed by one period from the output signal (gate driving pulse) of the prior stage. Accordingly, the gate driving pulses outputted from the respective stages (150a, 150b, . . . ) are provided to the gate lines (G1, G2, . . . ) of the LCD panel, to scan the gate lines (G1, G2, . . . ) in sequence.

As described above, a PMOS transistor is used as a switching device in the shift register. However, it is possible to use an NMOS transistor as the switching device instead of a PMOS transistor.

As described above, the shift register and the LCD device using the same have the following advantages.

The shift register according to the present invention further includes the additional switching device being turned-on by the logic of the start pulse without regard to the logic of the clock signal, so that it is possible to normally provide the start pulse to the node even though the start pulse is not synchronized with the clock signal.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A shift register comprising:
first to n-th stages that sequentially output gate driving pulses, wherein the first stage includes:
1) a first A switching device that is turned-on by a first clock signal having a low logic state and applies a start pulse to a first A node;
2) a second A switching device that is turned-on by the first clock signal having a low logic state and applies a first supply voltage to a second A node;
3) a third A switching device that is turned-on by the start pulse having a low logic state applied to the first A node and supplies a second clock signal to an output of the first stage;
4) a fourth A switching device that is turned-on by the first supply voltage applied to the second A node and supplies a second supply voltage to the output of the first stage;
5) a fifth A switching device that is turned-on by the start pulse having a low logic state and applies the start pulse to the first A node, wherein the fifth switching device is connected in parallel with the first A switching device and a gate of the fifth A switching device is directly connected to a source of the first A switching device;
6) a sixth A switching device that is turned-on by a state of the first A node and passes the second supply voltage therethrough; and
7) a seventh A switching device that is turned-on by the second clock signal having a low logic state and applies the second supply voltage passing through the sixth A switching device to the second A node;
wherein the start pulse is supplied only to the first stage among the first to the n-th stages;
wherein the pulse width of the start pulse at a low logic state is wider than the pulse width of the first or second clock signal at a low logic state when the pulse width of the start pulse at a low logic state overlaps the pulse width of the first or second clock signal at a low logic state;
wherein the second to the n-th stages respectively including:
1) a first B switching device that is turned-on by one of the first and second clock signals having a low logic state and applies an output signal of a prior stage to a first B node;
2) a second B switching device that is turned-on by one of the first and second clock signals having a low logic state and applies the first supply voltage to a second B node;
3) a third B switching device that is turned-on by the output signal applied to the first B node and supplies one of the first and second clock signals to an output of the stage;
4) a fourth B switching device that is turned-on by the first supply voltage applied to the second B node and supplies the second supply voltage to the output of the stage; and
5) a sixth B switching device that is turned-on by a state of the first B node and passes the second supply voltage therethrough; and
6) a seventh B switching device that is turned-on by one of the first and second clock signals having a low logic state and applies the second supply voltage passing through the sixth B switching device to the second B node;
wherein the first and second B switching devices included in odd numbered stages is supplied with the first clock pulse;
wherein the first and second B switching devices included in even numbered stages is supplied with the second clock pulse;
wherein the third B switching device included in odd numbered stages is supplied with the second clock pulse;
wherein the third B switching device included in even numbered stages is supplied with the first clock pulse.

2. The shift register of claim 1, wherein the first A to seventh A switching devices and first B to seventh B switching devices are formed of PMOS transistors.

3. The shift register of claim 1, wherein the source of the first A switching device is connected with a source of the fifth A switching device, a drain of the first A switching device is connected with a drain of the fifth switching device, and the gate of the fifth A switching device is connected with the source of the fifth switching device.

4. A display device comprising:
a display panel having a plurality of gate and data lines crossing each other; and
a gate driver that provides gate driving pulses sequentially to the gate lines of the LCD panel, the gate driver containing a shift register having first to n-th stages, wherein the first stage includes:
1) a first A switching device that is turned-on by a first clock signal having a low logic state and applies a start pulse to a first A node;
2) a second A switching device that is turned-on by the first clock signal having a low logic state and applies a first supply voltage to a second A node;
3) a third A switching device that is turned-on by the start pulse having a low logic state applied to the first A node and supplies a second clock signal to an output of the at least one stage;
4) a fourth A switching device that is turned-on by the first supply voltage applied to the second A node and supplies a second supply voltage to the output of the stage; and
5) a fifth A switching device that is turned-on by the start pulse having a low logic state and applies the start pulse to the first A node, wherein the fifth switching device is connected in parallel with the first A switching device and a gate of the fifth A switching device is directly connected to a source of the first A switching device;
6) a sixth A switching device that is turned-on by a state of the first A node and passes the second supply voltage therethrough; and
7) a seventh A switching device that is turned-on by the second clock signal having a low logic state and applies the second supply voltage passing through the sixth switching device to the second A node;
wherein the start pulse is supplied only to the first stage among the plurality of the first to the n-th stages;
wherein the pulse width of the start pulse at a low logic state is wider than the pulse width of the first or second clock signal at a low logic state when the pulse width of the start pulse at a low logic state overlaps the pulse width of the first or second clock signal at a low logic state;
wherein the second to the n-th stages respectively including:
1) a first B switching device that is turned-on by one of the first and second clock signals having a low logic state and applies an output signal of a prior stage to a first B node:
2) a second B switching device that is turned-on by one of the first and second clock signals having a low logic state and applies the first supply voltage to a second B node;

3) a third B switching device that is turned-on by the output signal applied to the first B node and supplies one of the first and second clock signals to an output of the stage;
4) a fourth B switching device that is turned-on by the first supply voltage applied to the second B node and supplies the second supply voltage to the output of the stage; and
5) a sixth B switching device that is turned-on by a state of the first B node and passes the second supply voltage therethrough; and
6) a seventh B switching device that is turned-on by one of the first and second clock signals having a low logic state and applies the second supply voltage passing through the sixth B switching device to the second B node;

wherein the first and second B switching devices included in odd numbered stages is supplied with the first clock pulse;

wherein the first and second B switching devices included in even numbered stages is supplied with the second clock pulse;

wherein the third B switching device included in odd numbered stages is supplied with the second clock pulse;

wherein the third B switching device included in even numbered stages is supplied with the first clock pulse.

* * * * *